United States Patent [19]

Tsen et al.

[11] Patent Number: 4,763,026
[45] Date of Patent: Aug. 9, 1988

[54] SENSE AMPLIFIER FOR SINGLE-ENDED DATA SENSING

[75] Inventors: Chan-Tang Tsen, Thousand Oaks; Karl H. K. Yang, San Jose, both of Calif.

[73] Assignee: National Semiconductor Corporation, Santa Clara, Calif.

[21] Appl. No.: 36,462

[22] Filed: Apr. 9, 1987

[51] Int. Cl.$^4$ .................... G01R 19/00; H03K 5/153; G11C 7/02
[52] U.S. Cl. .................... 307/530; 307/351; 307/352; 307/353; 307/354; 365/207; 365/208
[58] Field of Search .............. 307/530, 351, 352, 354, 307/355, 364, 494, 496, 497, 353; 365/207, 208

[56] References Cited

U.S. PATENT DOCUMENTS

| | | | |
|---|---|---|---|
| 3,376,515 | 4/1968 | Dilley | 330/270 |
| 3,444,472 | 5/1969 | Johnson | 330/258 |
| 3,474,345 | 10/1969 | Moses | 330/270 |
| 3,736,522 | 5/1973 | Padgett | 330/35 |
| 3,955,101 | 5/1976 | Amelio et al. | 307/279 |
| 4,075,609 | 2/1978 | Millhollan et al. | 365/154 |
| 4,099,266 | 7/1978 | Biggers | 365/208 |
| 4,166,982 | 9/1979 | Christopherson | 330/259 |
| 4,223,394 | 9/1980 | Pathak et al. | 365/210 |
| 4,301,518 | 11/1981 | Klaas | 365/185 |
| 4,313,177 | 1/1982 | Heuber et al. | 365/174 |
| 4,330,853 | 5/1982 | Heimeier | 365/227 |
| 4,342,102 | 7/1982 | Puar | 365/207 |
| 4,388,705 | 6/1983 | Sheppard | 365/210 |
| 4,598,389 | 7/1986 | Duvvury et al. | 307/530 |
| 4,602,167 | 7/1986 | Yukawa | 307/355 |
| 4,625,300 | 11/1986 | McElroy | 365/205 |

OTHER PUBLICATIONS

D. Azzis, "Current-Source Sealing Circuit," IBM Technical Disclosure Bulletin, vol. 19, No. 5, Oct., 1976.
J. W. Mitchell, "Monolithic Current Source," IBM Technical Disclosure Bulletin, vol. 13, No. 12, May, 1971.
S. Ogawa, et al., "Stabilized Reference Voltage Source," IBM Technical Disclosure Bulletin, vol. 13, No. 9, Feb., 1971.
W. Chin, "On-Chip Voltage Regulator," IBM Technical Disclosure Bulletin, vol. 19, No. 6, Nov., 1976.

Primary Examiner—Stanley D. Miller
Assistant Examiner—Trong Quang Phan
Attorney, Agent, or Firm—Limbach, Limbach & Sutton

[57] ABSTRACT

A sense amplifier circuit for single-ended data characterized by the responsiveness of the reference voltage to variations in processing parameters and tolerance for noise. Matching of the dataline voltage to the reference voltage enables the comparison of data with the reference to operate with greater accuracy. Isolation of the reference voltage preserves its integrity as a high logic state from subsequent variations in the dataline.

16 Claims, 3 Drawing Sheets

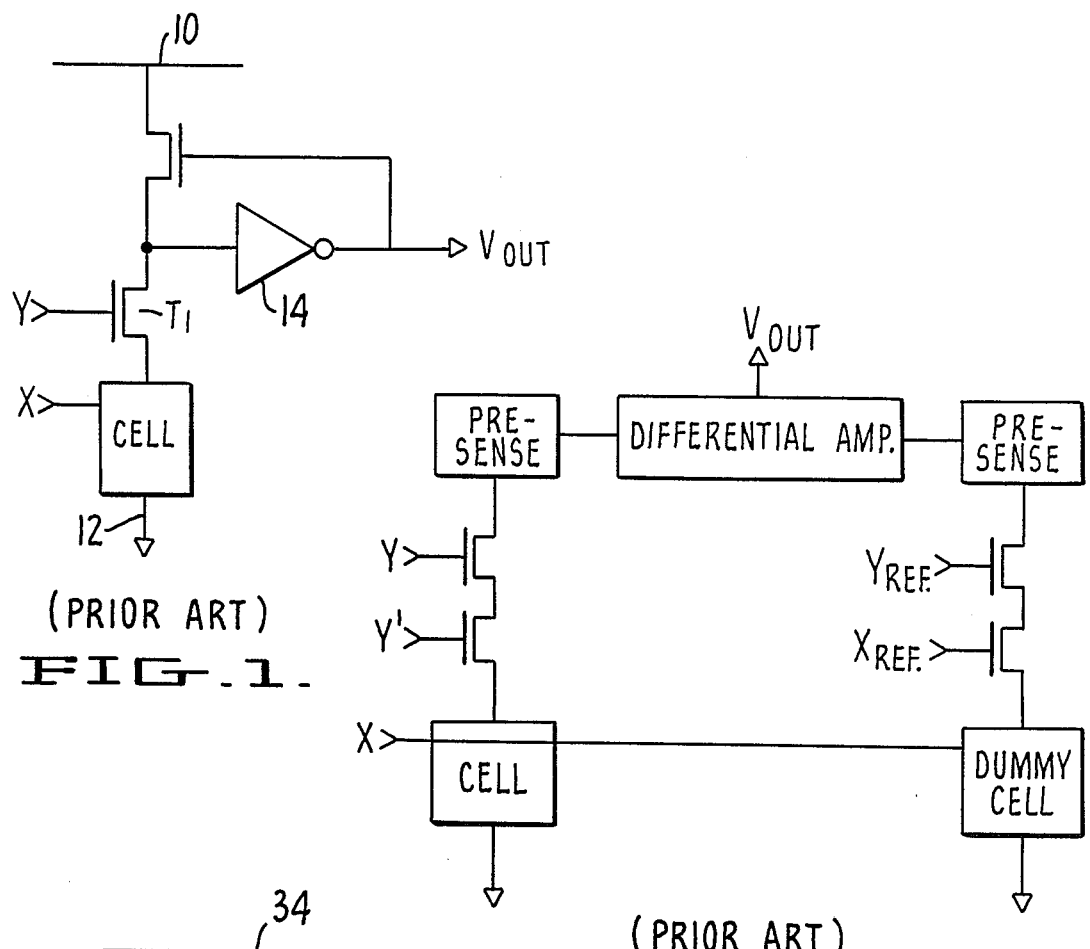
(PRIOR ART)
FIG. 1.
(PRIOR ART)
FIG. 2.
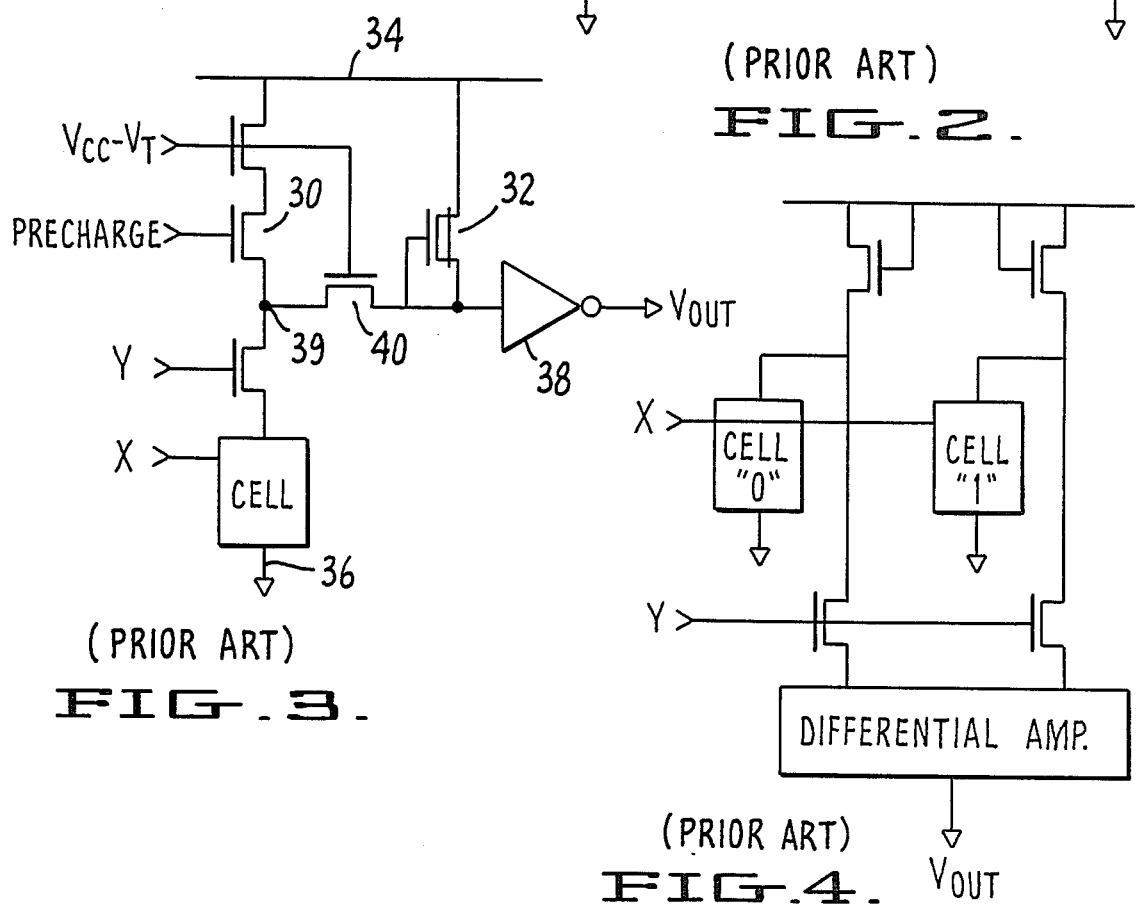
(PRIOR ART)
FIG. 3.
(PRIOR ART)
FIG. 4.

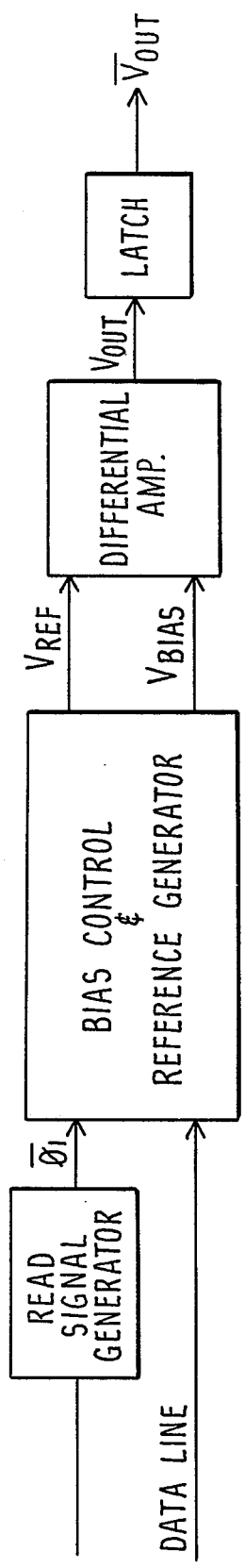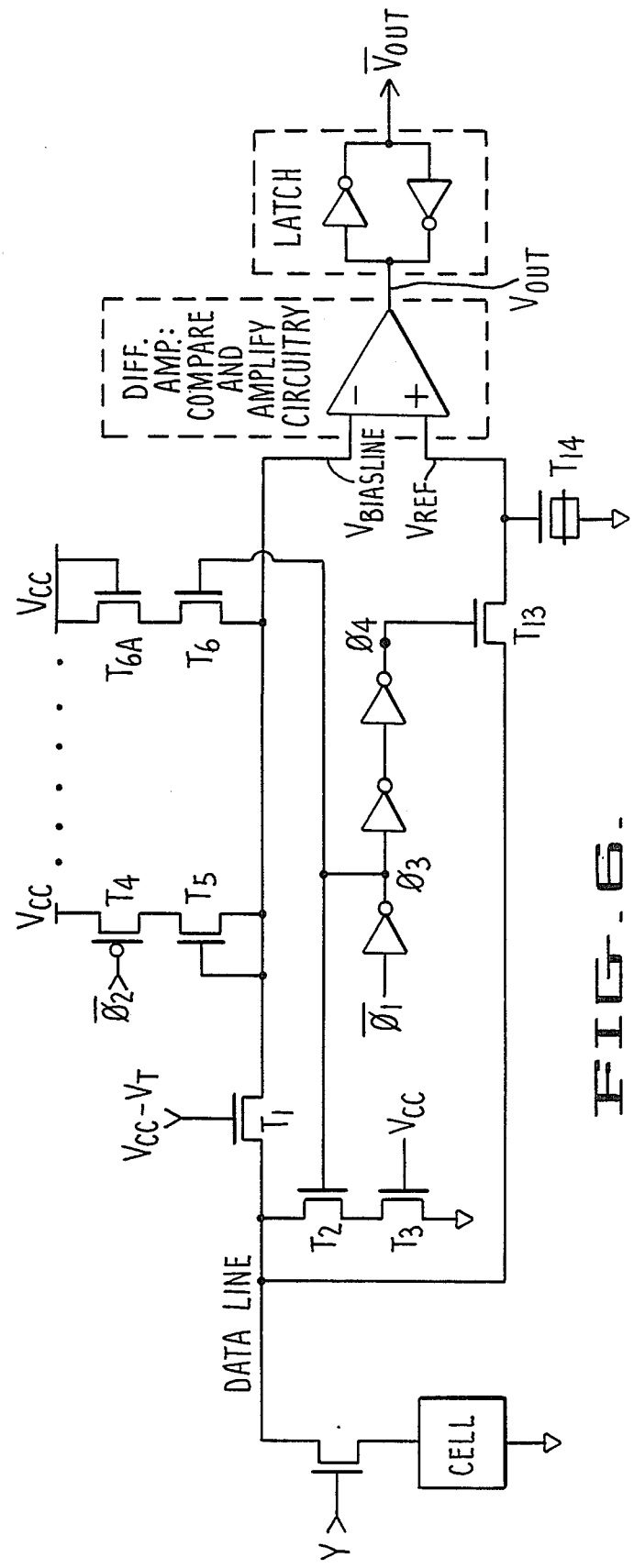

SENSE AMPLIFIER FOR SINGLE-ENDED DATA SENSING

TECHNICAL FIELD OF THE INVENTION

The present invention relates generally to electronic integrated circuits and, in particular, to a sample-and-hold sense amplifier which uses the input signal itself to obtain the reference voltage.

BACKGROUND ART

A semiconductor memory device commonly comprises an array of rows and columns. Each intersection of the rows and columns defines a memory "cell". A cell stores either a logical '0' or a logical '1'. Associated with each column is a device which is used to detect changes in the logic state of the cells in that column. This device is usually called a sense amplifier because it "senses" a change in the logic state of the cell and amplifies it for transmission to the next stage of the circuit.

To perform this function, a sense amplifier must be able to distinguish between a '0' and a '1'. One of the problems associated with distinguishing a '1' is charge leakage. Over time, the voltage level in the cell decays. When the sense amplifier compares a decayed or stale '1' with a reference voltage that defines a clear '1', the cell appears to the sense amplifier to be storing a '0'.

Several different techniques are available for performing sense amplification. One such technique uses what is known as a "sample-and-hold" function. According to this technique, the sense amplifier samples the memory cell and holds the sampled voltage for a precisely controlled period of time. At the end of the time span, the voltage will have become attenuated. By measuring the voltage attenuation, the circuit distinguishes a '0' from '1'. The measurement is performed by comparing the attenuated sample with another stable and known voltage level, often called the reference voltage Vref. A sampled voltage which is above the reference voltage Vref at the end of the time span is identified as a '1'; conversely, a sampled voltage which is below Vref is identified as a '0'. Since the measurement is done with respect to a reference voltage Vref, this type of device is called a reference voltage comparator.

One of the problems associated with this technique is the variability in the amount of attenuation. The sense amplifier is made to measure attenuation to a certain limit before the output will change to '0'. Due to variation in the time passing since the memory cell was last read, as well as variations in processing the device, the amount of attenuation occurring for a '1' is not always what the sense amplifier will identify as a '1'.

FIG. 1 shows a conventional level shifting sense amplifier. When the memory cell is storing a '1', current drains from the power source 10 to ground 12. The input to the inverter 14 is held low; thus, the output is held high. When the cell is storing a '0', no current flows. The input to the inverter stays high since transistor $T_1$ is now off and the output of the inverter is low, i.e. '0'. This design, while instructive, is no longer widely used. The design requires extra dc power for the inverter and is overly sensitive to both positive going noise and fluctuations in the power supply.

FIG. 2 shows a conventional sense amplifier that uses "dummy cells". A dummy cell is a circuit which is a duplicate of the memory cell. It stores the voltage level of the memory cell from some prior time. This sense amplifier design is essentially of the sample-and-hold type. For a reference voltage, the sense amplifier uses the dummy cell voltage. The reference is thus highly dependent on processing variations. Nor does this design respond well to noise on the cell column lines. Dummy cell sense amplifiers are also undesirable due to their size and power needs. Normally, one column of dummy cells is required for each half of the memory array. Given the ever-increasing number of cells contained in state-of-the-art memory devices, this results in a constraint on the total "usable" memory that will fit on a semiconductor chip of limited size.

FIG. 3 shows a variation on the above-described conventional level shifting design. The FIG. 3 design, which uses a high trip inverter, includes a bias line and a precharge switch. Transistor 30 is turned on to raise the bias line to its upper limit. Transistor 32 holds the bias line high. Transistor 30 is turned off so that no current will drain from the power supply 34 to ground 36 when the cell is accessed. The input to the inverter 38 is thus a '1' and the output is a '0'. If the cell is storing a '0', then no current will flow between node (39) and ground and the output of the inverter remains as it was, i.e. low. If the cell is storing a '1', then current drains from the bias line through transistor 40 to ground. The bias line is thus "pulled" low by the cell and the output of the inverter 38 goes high, i.e. to '1'. This design is sensitive to noise and to charge remaining on the dataline from the last read cycle. The inverter 38 has a threshold voltage at which it responds to the input as if it were '1'. This threshold is sensitive to variations in processing the device.

FIG. 4 shows a variation of the "dummy cell" type of sensing amplifier. In the FIG. 4 circuit, a copy of the inverse of the voltage stored in a memory cell is retained for subsequent comparison with a reference. While this solution avoids some problems associated with sense amplifiers, it again requires chip area to house the dummy cells.

U.S. Pat. No. 4,301,518 entitled "Differential Sensing of Single Ended Memory Array" issued Nov. 17, 1981 to J. M. Klaas, discloses a differential sensing circuit for producing a data output. The Klaas sense circuit allows the array to be biased independent of the sense operation. A reference voltage is provided for direct comparison to the operating point of the selected column line, producing a differential voltage the polarity of which indicates the logic state of the selected cell.

U.S. Pat. No. 4,166,982 entitled "Logic Circuit Reference Electric Level Generating Circuitry", issued Sept. 4, 1979 to W. A. Christophersen, discloses the use of a reference voltage and/or current for distribution to a plurality of logical circuits on a semiconductor chip having of the order of a thousand such circuits thereon. An operational amplifier and evener circuitry drives the reference voltage distribution grid laid out over the semiconductor chip.

Examples of typical bipolar sense amplifiers are provided in U.S. Pat. No. 3,376,515 issued Apr. 2, 1968 to W. G. Dilley and U.S. Pat. No. 4,099,266 issued July 4, 1978 to C. Biggers. An example of reading or writing MTL (merged transistor logic) is disclosed in U.S. Pat. No. 4,330,853 issued May 18, 1982 to H. H. Heimeier et al.

In summary, prior art sense amplifiers are subject to several limitations. Reference voltages derived from power sources independent of the dataline are insensitive to variations in threshold voltages. Changes in the power sourcing the reference voltage can cause it to be unresponsive. Off-chip reference voltages are limited by exacting requirements for processing parameters, slight deviations in production proving fatal to accuracy. Also, speed limitations are present due to noise sensitivity, resulting in an inaccurate reading of the cell's memory.

Reference voltages generated from the dataline itself would not be subject to these limitations.

SUMMARY OF THE INVENTION

It is an object of the present invention to provide a sense amplifier circuit that requires no dc power to support the reference voltage.

It is an object of the present invention to provide a sense amplifier circuit wherein the change in voltage on the dataline is relatively independent of power supply voltage.

It is a further object of the present invention to provide a sense amplifier circuit wherein the reference voltage is responsive to noise effects and threshold voltages on the data line.

It is a further object of the present invention to provide a sense amplifier circuit with high access speed.

Thus, in accordance with one embodiment of the present invention, a column of memory cells of the EEPROM type employs a sense amplifier circuit for producing a data output voltage. The sense amplifier compares a stable reference voltage with the voltage stored in a selected memory cell in an associated memory column, producing a differential voltage the polarity of which indicates the logic state of the selected memory cell. The stable voltage reference is derived from the column line immediately before the above-mentioned comparison is made to more accurately match the voltage level of the selected cell and to produce the correct logic output.

BRIEF DESCRIPTION OF THE DRAWINGS

FIG. 1 is a schematic diagram illustrating a conventional level shifting sense amplifier.

FIG. 2 is a schematic diagram illustrating a conventional sense amplifier of the type that uses a dummy cell.

FIG. 3 is a schematic diagram illustrating a conventional sense amplifier of the type that uses a high trip inverter.

FIG. 4 is a schematic diagram illustrating a conventional variation of the dummy cell type of sense amplifier.

FIG. 5 is a block diagram illustrating a sense amplifier in accordance with the present invention;

FIG. 6 is a schematic diagram illustrating a sense amplifying circuit in accordance with the present invention;

DETAILED DESCRIPTION OF SPECIFIC EMBODIMENT

FIG. 5 shows a block diagram of a sense amplifier for detecting a change in a single-ended dataline input using a stable reference voltage which is derived form the data line input. The dataline input and a clock signal $\phi$, which is generated by a read signal generator, are provided to bias control and reference generator circuitry which derives the reference voltage $V_{REF}$. The reference volta $V_{REF}$ and a bias line voltage $V_{BIAS}$ are provided by the bias control and reference generator to a differential amplifier. The differential amplifier compares the two voltages $V_{REF}$ and $V_{BIAS}$ and generates an output $V_{OUT}$ which is related to the state of the dataline input. The amplifier output $V_{OUT}$ is provided to a latch which holds the output $V_{OUT}$ past the end of the read cycle and provides an output $V_{OUT}$ which corresponds to the state of the dataline input.

Figure 7:
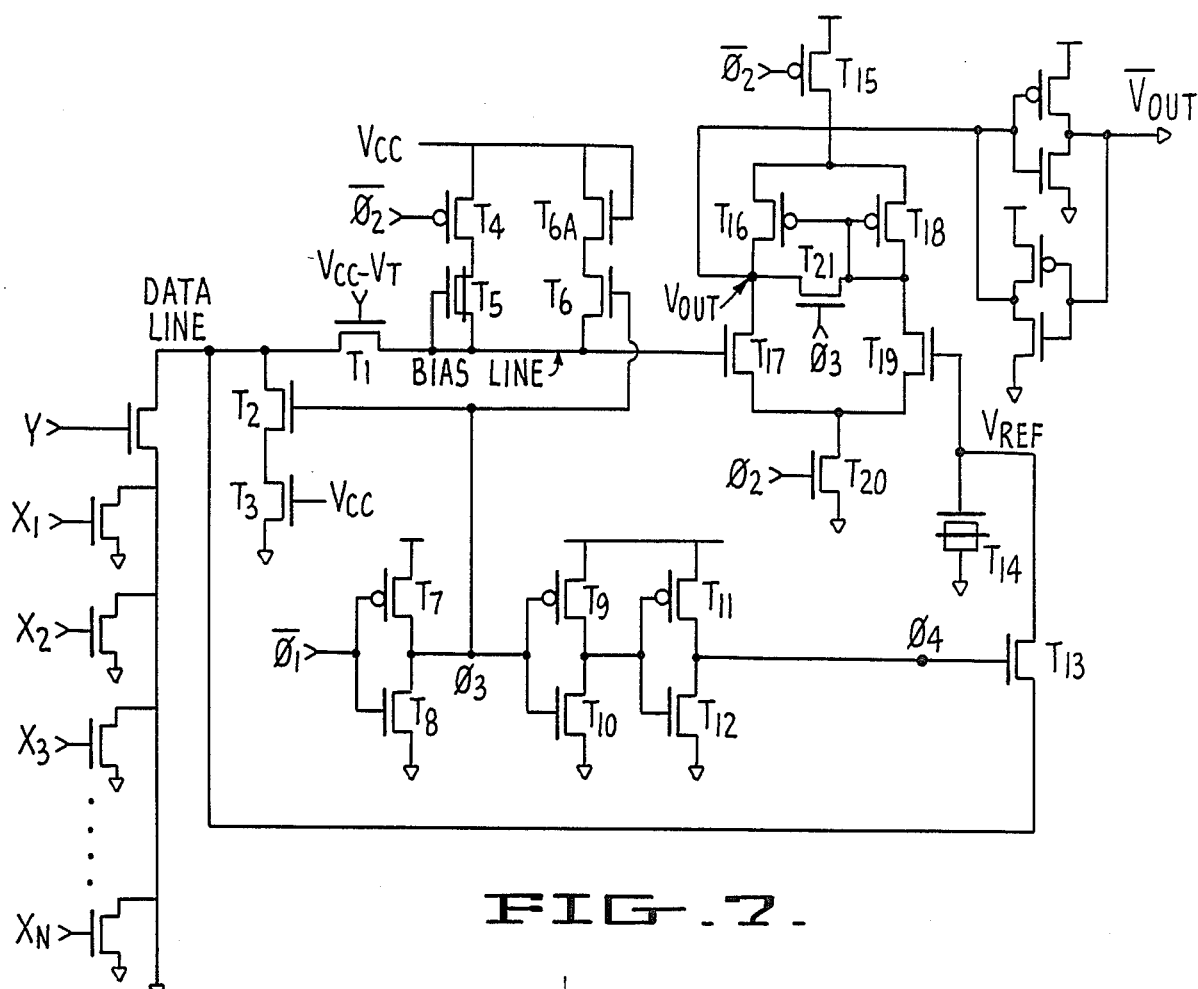
FIG. 7 is a schematic diagram illustrating an alternative embodiment of a sense amplifying circuit in accordance with the present invention.

Referring to FIG. 7, a column of memory cells comprising transistors $X_1$-$X_N$ is shown connected to a dataline. The column represents a typical load for the sense amplifier of the present invention. An appropriate voltage applied to the gate of transistor Y selects this particular column for sense amplification.

Transistors $X_1$ through $X_N$ each represent a separate cell of memory.

If a particular cell $X_1$-$X_N$ is on, the voltage at the gate of that device is high, representing a logic '1'. Under these circumstances, the cell operates to sink large amounts of current to the ground of its device. If the cell is off, the voltage at the X gate is low, representing a logic '0'. Under such circumstances, the current through the dataline remains largely unaffected.

While the sense amplifier of the present invention will be described below with reference to a specific load, this description is not intended to be construed in a limiting sense. Various loads, as well as other embodiments of the invention, will be apparent to persons skilled in the art upon reference to the following description.

Figure 8:
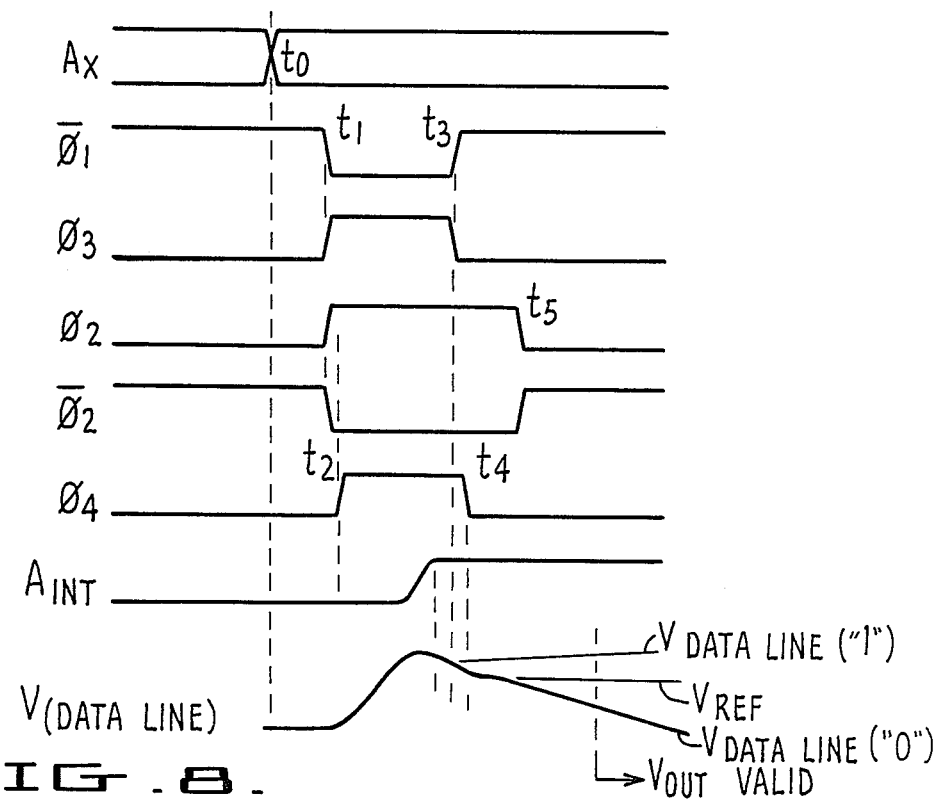
FIG. 8 is a timing diagram illustrating the timing necessary to operate the circuit shown in FIG. 7 in accordance with the present invention.

The read signal necessary to activate the sense amplifier circuit of the present invention is generated external to the circuit and fed to the circuit in the form of a clock $\phi_1$. All other clocks or control signals $\phi_2$, $\overline{\phi_2}$, $\phi_3$, and $\phi_4$ are derived from this original signal. Clock $\phi_3$, the clock controlling the precharge period, is derived by inverting $\phi_1$ using a typical CMOS inverter. As shown in FIG. 8, clock $\phi_3$ goes high at time $t_1$ and goes low at $t_3$, during which time the precharge operation is completed. Clocks $\phi_2$ and $\overline{\phi_2}$ both activate their respective transistors at the same time, i.e. $t_1$. Both clocks remain active, however, until the completion of the read cycle at time $t_5$.

As shown in FIG. 7, the dataline is connected to three separate devices, the first device being transistor $T_2$. Transistors $T_2$ and $T_3$ operate together as a small current drain to remove residual charge from the dataline remaining from the last read cycle. The dataline is connected to the drain of transistor $T_2$, the source of transistor $T_2$ is connected to the drain of transistor $T_3$, and the source of transistor $T_3$ is connected to ground. The gate of transistor $T_3$ is connected to $V_{cc}$. The gate of transistor $T_2$ is connected to both clock $\phi_3$ and to the gate of transistor $T_6$.

The current drain formed by transistors $T_2$ and $T_3$ is deactivated before reference voltage $V_{ref}$ is isolated from the dataline at time $t_4$. The current drain is small enough to have no effect on the charging of the bias line. The current drain is activated at time $t_1$ and deactivated at time $t_3$, activation and deactivation being controlled by clock $\phi_3$.

The dataline is also connected to the source of transistor $T_1$. The gate of transistor $T_1$ is fixed at $V_{cc} - V_t$ and is connected to the bias line.

The dataline is also connected to the drain of transistor $T_{13}$. The gate of transistor $T_{13}$ is controlled by clock $\phi_4$. The source of transistor $T_{13}$ is connected to the gates of both transistors $T_{14}$ and $T_{19}$. Transistor $T_{14}$ functions as a capacitor or charge storage. This is a heavy node, and therefore is highly noise resistant. The charge storage function is achieved by use of a depletion device. This node, i.e., the common gate of transistors $T_{14}$ and $T_{19}$ and the drain of transistor $T_{13}$, provides a reference voltage $V_{ref}$ to a differential amplifier comprising transistors $T_{15}$, $T_{16}$, $T_{17}$, $T_{18}$, $T_{20}$, and $T_{21}$.

The differential amplifier may be one of many conventional differential amplifiers. The differential amplifier circuit shown in FIG. 7 consists of a balanced pair of driver transistors $T_{17}$ and $T_{19}$ along with p-type load transistors $T_{16}$ and $T_{18}$. Transistor $T_{20}$ connects both of the driver transistors $T_{17}$, $T_{19}$ to ground and has a bias on its gate to cause it to operate as a current source. The bias on the gate of transistor $T_{20}$ is controlled by clock $\phi_2$ which begins to activate device $T_{20}$ at the inception of the precharge period. The load transistors $T_{16}$ and $T_{18}$ share a common gate. This gate is connected to a switch $T_{21}$. The gate of switch $T_{21}$ is controlled by clock $\phi_3$, which activates the switch $T_{21}$ at the inception of the precharge period. When active, the switch $T_{21}$ acts to balance the loads on transistors $T_{16}$ and $T_{18}$. Transistors $T_{16}$ and $T_{18}$ share a common source. This source is connected to the drain of $T_{15}$, a p-type transistor $T_{15}$. The gate of transistor $T_{15}$ is controlled by clock $\phi_2$, which is inverted to $\overline{\phi_2}$ in order to activate the device $T_{15}$ during the precharge period. Transistor $T_{15}$ operates to set up the differential amplifier.

Differential amplifiers of this type are bi-stable circuits. That is, either transistors $T_{16}$ and $T_{17}$ are on during operation and transistors $T_{18}$ and $T_{19}$ are off, or visa versa. The output of the differential amplifier may be taken from either the drain of transistor $T_{16}$ or from the drain of transistor $T_{18}$.

FIG. 7 shows the output of the differential amplifier connected to the drain of transistor $T_{16}$. Since switch $T_{21}$ is deactivated at the end of the precharge period, and is thereafter effectively an open circuit, the source of transistor $T_{16}$ is not equivalent to the source of transistor $T_{18}$.

One input to the differential amplifier is the gate of transistor $T_{17}$ which is connected to the bias line. The other input to the differential amplifier is reference voltage $V_{ref}$. The output of the differential amplifier, $V_{out}$, will tend to go high or low depending on the polarity of the difference between the voltages on the inputs. The final output may be obtained in several ways from this first or primary output. Often several stages of the circuit operating as the differential amplifier, that is, the compare and amplify circuitry, would be cascaded to form a high gain sense amplifier.

$V_{out}$ is fed into a conventional latch which in FIG. 7 comprises two CMOS inverters. $V_{out}$ is the input to a first inverter. The output of the first inverter is then connected to the input of the second inverter. The output of the second inverter returns as input to the first inverter. This operates to convert the amplified signal $V_{out}$ to a clear logic "0" or logic "1". Often several stages of the latch circuitry would be cascaded to form the logical output necessary to correspond with the reading of the data cell.

During the precharge period, the bias line, which extends from the drain of transistor $T_1$ to the gate of transistor $T_{17}$, is raised in voltage level to its maximum point. The bias line is a light node, and at most reaches the voltage level of $V_{cc}-V_t$. Transistor $T_{6A}$ is connected by its source to the drain of transistor $T_6$. The gate of transistor $T_{6A}$ is connected to the power source $V_{cc}$. The drain of transistor $T_{6A}$ is also connected to the power source. Connected thus, transistor $T_{6A}$ acts as a current source by operating in the saturated mode. This provides that the source of transistor $T_{6A}$, which is connected to the drain of transistor $T_6$, is always at $V_{cc}-V_t$. When the clock $\phi_3$ on the gate of transistor $T_6$ activates $T_6$, transistor $T_6$ is operating in a linear mode and the voltage at the drain of transistor $T_6$ is passed down to the bias line which is connected to the source of transistor $T_6$. So connected, transistors $T_6$ and $T_{6A}$ provide a maximum limit of $V_{cc}-V_t$ on the voltage level of the bias line.

The bias line is also connected to transistor $T_5$. Transistor $T_5$ is a depletion device with its gate connected to its source. The drain of transistor $T_5$ is connected to the drain of p-type transistor $T_4$. The gate of transistor $T_4$ is controlled by clock $\phi_2$ which activates transistor $T_4$ at the inception of the precharge period and remains active until the end of the read cycle. The source of transistor $T_4$ is connected to the power supply $V_{cc}$. Thus connected, transistors $T_5$ and $T_4$ operate as a current source. Transistors $T_5$ and $T_4$ are dimensioned so as to provide a small current source. Since transistor $T_5$ is sourcing a small current, it is very resistant. The drain voltage stays close to $V_{cc}-V_t$. With a large resistive value, the source of transistor $T_5$ also stays high. The current source provides support for the bias line voltage level after the precharge period is over. Thus, when transistor $T_6$ is turned off, the bias line will remain at its high level or $V_{cc}-V_t$ due to transistor $T_5$, unless a '1' is being read from one of the cells. If a '1' is being read from a cell, the cell is acting as a large current sink or drain. The drain from the cell may easily overpower the small current sourced through transistor $T_5$. Thus the bias line level is lowered to reflect the data input.

The controlling clock on the gate of transistor $T_{13}$ is activated shortly after the beginning of the precharge period. The clock signal $\phi_4$ is derived from clock $\phi_3$ by inputting clock $\phi_3$ through two CMOS inverters, connected end-to-end. Thus, clock $\phi_4$ is a reflection of clock $\phi_3$, only slightly delayed in time. More precisely, clock $\phi_4$ is delayed by two gate delays or the time necessary for the signal to pass through both inverters. At the end of the precharge period, the bias line voltage is approximately $V_{cc}-V_t$. The dataline voltage at this time is approximately $V_{cc}-2V_t$. The second threshold voltage reflects the voltage drop across transistor $T_1$. The approximation is necessary to reflect the adjustment made to the dataline by the load. Thus, the effect of the load and the voltages along the column of cell lines adjusts the voltage that will be passed through transistor $T_{13}$ to the reference node. This provides a reference voltage with a more accurate reflection of the cell voltages.

It is important to note that the gate of transistor $T_{13}$ stays active slightly after the precharge period. Precharge ends at time $t_3$, whereas the gate of transistor $T_{13}$ is slightly delayed by the two inverter gates and stays active until $t_4$. This intentional overlap in time is important because it allows the reference voltage to most accurately reflect slight variations in the dataline voltage as it reaches its maximum level. It is also important to note that the small current drain formed by transistors $T_2$ and $T_3$ is turned off at the end of precharge and does not affect the voltage on the dataline during this small overlap in time, $t_3$ and $t_4$.

Referring to FIG. 7 and FIG. 5, the bias control and generation of the voltage reference $V_{ref}$ are performed by transistors $T_1$-$T_{14}$ as well as by the timing mechanisms necessary to operate them as directed. FIG. 6 shows this bias control and reference voltage generator circuitry connected to a simple load of one cell, with the output of a bias line and voltage reference fed into a standard differential amplifier, the output of which is connected to a standard latch. FIG. 8 shows the timing necessary to operate FIG. 7 as well as the voltage levels of address lines and the dataline. $A_x$ represents a signal notifying separate circuitry of a change in address. The $A_x$ signal is fed into a read signal generator producing an output of clock $\phi_1$ at time $t_1$ for input to the invention. The signal $A_{INT}$ reflects the interior address change. During the read cycle, the logic level on the gate of a cell may go high. The result of a high logic level on the gate of a cell is to pull the voltage level of the dataline to a low level. Before the dataline is pulled low, the reference voltage is derived from the dataline, then isolated after time $t_4$ to preserve its integrity as a accurate reflection of a high voltage level on the data column line. After time $t_4$ but before time $t_5$, the dataline voltage level will continue to fall, pulling the bias line down with it. Time $t_5$ is sufficiently delayed to allow the bias line to fall to its minimum level as dictated by the logic level of the cell. After time $t_5$, the differential amplifier is deactivated by $\phi_2$ and $\overline{\phi_2}$ and the result of the comparison between reference voltage $V_{ref}$ and the bias line voltage level is locked into the latches.

It may be observed that reference voltage $V_{ref}$ is approximately $V_{cc}-2V_t$, the approximation reflecting variations generated from the load connected to the device. Yet the bias line is only precharged to the level of $V_{cc}-V_t$. It should be noted that this difference of one threshold voltage is of no consequence in the accuracy of the compare and amplify circuitry. If the logic level of a cell is low or zero, the bias line will remain at its maximum value $V_{cc}-V_t$. The differential amplifier in comparing this bias line level with $V_{cc}-2V_t$ or the reference voltage will always generate an output that reflects the higher level of the bias line. Should the cell value be a logic level '1', and the bias line voltage drops, the bias line will drop significantly more than one threshold voltage as the current drain by the cell is strong enough to overpower transistors $T_5$ and $T_4$, the current source maintaining the bias line's maximum level. Thus, the bias line voltage will sink well below the level needed by the differential amplifier to produce an output reflecting $V_{ref}$ as the larger voltage.

It should be understood that various alternatives to the embodiments of the invention described herein may be employed in practicing the invention. It is intended that the following claims define the invention and that circuits within the scope of these claims and their equivalents be covered thereby.

What is claimed is:

1. A method of providing a stable reference voltage derived from the dataline voltage and detecting a change in single ended data input, said method comprising the following steps:
   (a) raising the bias line voltage to its maximum level;
   (b) storing the dataline voltage;
   (c) isolating the stored dataline voltage, thus obtaining the stable reference voltage;
   (d) accessing the data such that the bias line voltage reflects the data input; and
   (e) comparing the bias line voltage to the reference voltage and amplifying the difference with a difference amplifier such that an output voltage reflects the data input.

2. A sense amplifier circuit for detecting a change in single-ended data input using a stable reference voltage, the circuit comprising:
   (a) an input signal on a dataline;
   (b) a switch connecting the dataline to a bias line, a voltage level of the dataline being the dataline voltage, a voltage level of the bias line being the bias line voltage;
   (c) a switch connecting the dataline to a storage device;
   (d) means for generating a reference voltage derived from the dataline; and
   (e) a differential amplifier connected to receive the bias line voltage and the reference voltage for comparing the two voltages and for generating an output voltage related to the input signal.

3. A sense amplifier circuit as in claim 2 and further including a latch for holding the output voltage past the end of a read cycle.

4. A sense amplifier circuit as in claim 2 wherein the raising of the bias line voltage to its maximum level occurs during a precharge period which begins at some time $t_1$ in response to a read signal.

5. A sense amplifier circuit as in claim 2 wherein the compare and amplifying function performed by the differential amplifier activates and balances in response to a read signal at a time $t_1$.

6. A sense amplifier circuit as in claim 2 wherein the bias line voltage is maintained at its maximum level until the end of a read cycle unless the data input when accessed is a '1'.

7. A sense amplifier circuit as in claim 6 wherein the bias line voltage is maintained by activating a small current source to the bias line at time $t_1$.

8. A sense amplifier circuit as in claim 2 wherein the storage and isolation of the dataline voltage are completed shortly after the end of the precharge period.

9. A sense amplifier circuit as in claim 8 wherein the storage of the dataline voltage is performed by a capacitor having a heavy, noise resistant node.

10. A sense amplifier circuit as in claim 9 wherein the dataline voltage is passed on to the capacitor with a switch and isolated from the dataline by the same switch.

11. A sense amplifier circuit as in claim 10 wherein the isolated dataline voltage serves as the reference voltage and is sufficient to activate a branch of the differential amplifier.

12. A sense amplifier circuit as in claim 11 wherein the maximum level of the bias line is either substantially equal to the dataline voltage level.

13. A sense amplifier circuit as in claim 12 wherein the maximum level of the bias line is sufficient to activate a branch of the differential amplifier.

14. A sense amplifier circuit as in claim 11 or 13 wherein the output voltage is a '1' only if the bias line voltage is less than the reference voltage.

15. A sense amplifier circuit as in claim 2 wherein the output voltage is the input to a latch where the latch holds the data after the end of a read cycle.

16. A sense amplifier circuit as in claim 2 wherein a small current drain attaches to the dataline and is activated in response to the read signal and deactivated at the end of the precharge period.

* * * * *

UNITED STATES PATENT AND TRADEMARK OFFICE
CERTIFICATE OF CORRECTION

PATENT NO. : 4,763,026
DATED : August 9, 1988
INVENTOR(S) : Chan-Tang Tsen and Karl H.K. Yang It is certified that error appears in the above - identified patent and that said Letters Patent is hereby corrected as shown below:

Col. 4, line 4 "volta" should be --voltage--.

Col. 4, line 38 "$\phi_1$" should be --$\overline{\phi_1}$--.
"$\phi_2$" should be --$\overline{\phi_2}$--. (second occurrence)

Col. 4, line 41 "$\phi_1$" should be --$\overline{\phi_1}$--.

Col. 5, line 30 "to $\phi_2$" should be --to $\overline{\phi_2}$--.

Col. 6, line 21 "$\phi_2$" should be --$\overline{\phi_2}$--.

Col. 7, line 30 "and $\phi_2$ and" should be --and $\overline{\phi_2}$ and--.

Signed and Sealed this

Twenty-seventh Day of December, 1988

*Attest:*

DONALD J. QUIGG

*Attesting Officer*  *Commissioner of Patents and Trademarks*